United States Patent
Liu et al.

(12) United States Patent
    Liu et al.

(10) Patent No.: US 11,177,183 B2
(45) Date of Patent: Nov. 16, 2021

(54) THICKNESS MEASUREMENT SYSTEM AND METHOD

(71) Applicant: TAIWAN SEMICONDUCTOR MANUFACTURING CO., LTD., Hsinchu (TW)

(72) Inventors: Yan-Hong Liu, Hsinchu County (TW); Chien-Chih Wu, Taoyuan (TW); Che-Fu Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/505,360

(22) Filed: Jul. 8, 2019

(65) Prior Publication Data
    US 2020/0091013 A1    Mar. 19, 2020

Related U.S. Application Data

(60) Provisional application No. 62/733,604, filed on Sep. 19, 2018.

(51) Int. Cl.
| | |
|---|---|
| *H01L 21/00* | (2006.01) |
| *H01L 21/66* | (2006.01) |
| *H01L 21/67* | (2006.01) |
| *H01L 21/677* | (2006.01) |
| *H01L 21/687* | (2006.01) |

(52) U.S. Cl.
    CPC ........ *H01L 22/12* (2013.01); *H01L 21/67167* (2013.01); *H01L 21/67253* (2013.01); *H01L 21/67703* (2013.01); *H01L 21/67745* (2013.01); *H01L 21/68707* (2013.01)

(58) Field of Classification Search
    CPC ............... H01L 22/12; H01L 21/67167; H01L 21/67253; H01L 21/67745; H01L 21/68707
    See application file for complete search history.

(56) References Cited

U.S. PATENT DOCUMENTS

| | | | | |
|---|---|---|---|---|
| 6,194,234 B1 * | 2/2001 | Huang | .................... | H01L 22/12 257/E21.53 |
| 6,284,986 B1 | 9/2001 | Dietze et al. | | |
| 6,498,396 B1 * | 12/2002 | Arimoto | ................. | H01L 24/02 257/737 |

(Continued)

FOREIGN PATENT DOCUMENTS

| | | |
|---|---|---|
| CN | 1925107 A | 3/2007 |
| CN | 101061253 A | 10/2007 |

(Continued)

*Primary Examiner* — Richard A Booth
(74) *Attorney, Agent, or Firm* — Maschoff Brennan

(57) ABSTRACT

A system includes a factory interface, a deposition tool, and at least one measuring device. The factory interface is configured to carry a wafer. The deposition tool is coupled to the factory interface and configured to process the wafer transferred from the factory interface. The at least one measuring device is equipped in the factory interface, the deposition tool, or the combination thereof. The at least one measuring device is configured to perform real-time measurements of a thickness of a material on the wafer that is carried in the factory interface or the deposition tool.

20 Claims, 5 Drawing Sheets

(56) References Cited

U.S. PATENT DOCUMENTS

| | | | |
|---|---|---|---|
| 6,790,376 B1* | 9/2004 | Markle | H01L 21/67253 216/59 |
| 9,349,624 B2* | 5/2016 | Wilby | H01L 21/67253 |
| 9,607,908 B1* | 3/2017 | Takeda | H01L 21/265 |
| 10,400,167 B2* | 9/2019 | Liu | H01L 21/30608 |
| 2004/0209554 A1 | 10/2004 | Tsumagari et al. | |
| 2007/0046927 A1* | 3/2007 | Le | C23C 16/54 356/73 |
| 2007/0173039 A1* | 7/2007 | Tagusa | H01L 21/02422 438/487 |
| 2011/0015773 A1 | 1/2011 | Wilby | |
| 2017/0148654 A1* | 5/2017 | Paul | H01L 21/68707 |
| 2017/0345688 A1 | 11/2017 | Lee et al. | |

FOREIGN PATENT DOCUMENTS

| | | |
|---|---|---|
| CN | 102506773 A | 6/2012 |
| CN | 203177833 U | 9/2013 |
| CN | 103363909 A | 10/2013 |
| JP | 2014008538 A | 1/2014 |
| TW | 200947578 A | 11/2009 |
| TW | 201726895 A | 8/2017 |
| TW | 201834117 A | 9/2018 |

\* cited by examiner

THICKNESS MEASUREMENT SYSTEM AND METHOD

PRIORITY CLAIM AND CROSS-REFERENCE

The present application claims priority to U.S. Provisional Application Ser. No. 62/733,604, filed Sep. 19, 2018, which is herein incorporated by reference.

BACKGROUND

A measurement or test of a conventional deposition process is performed after the following processes are done. The status of the deposition process is able to be known after the measurement or the test is done. Thus, an off-line measurement is performed to know the status of the deposition process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
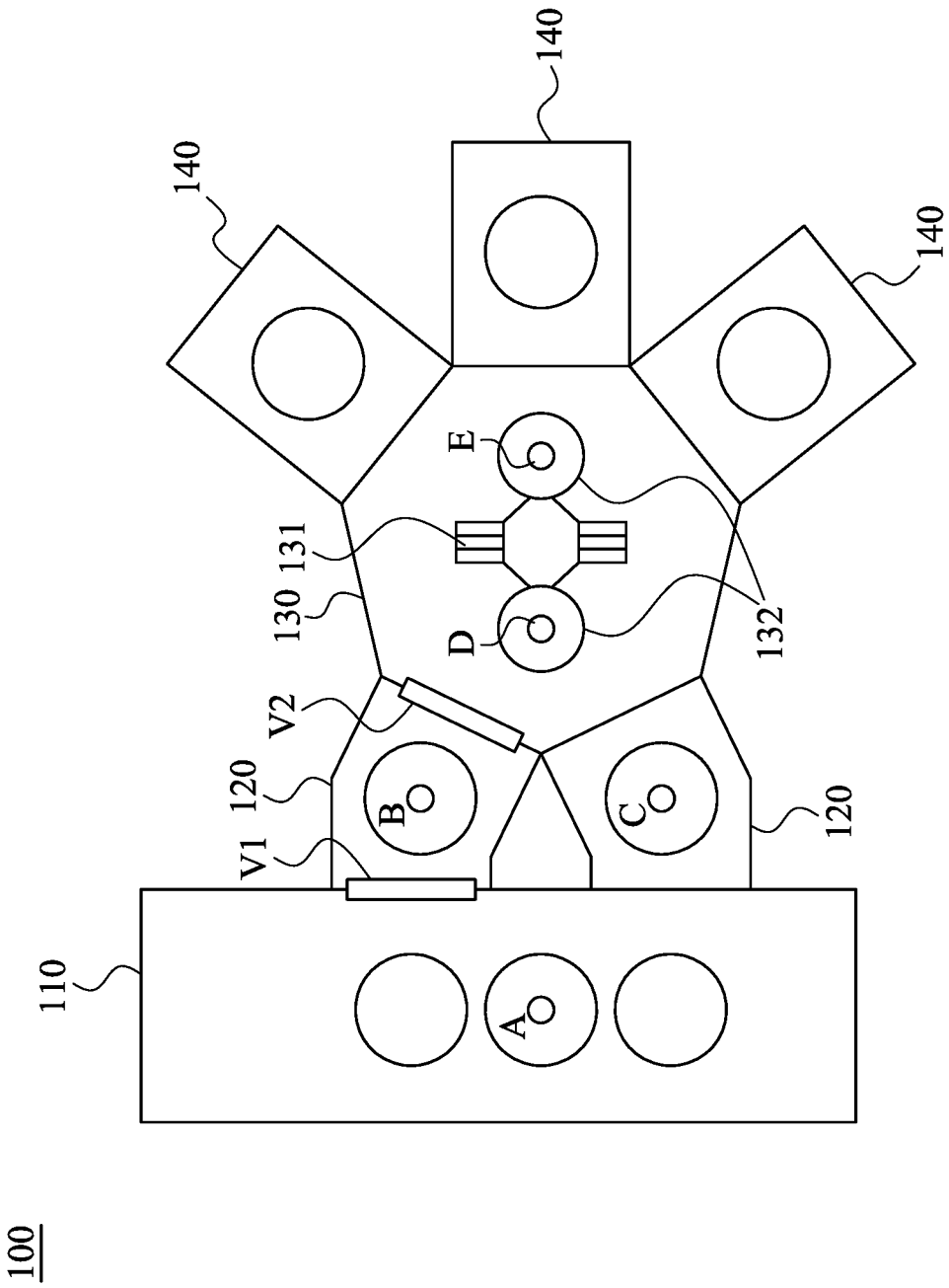
FIG. 1 is a top view illustrating a multi-chamber system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Reference is made to FIG. 1. FIG. 1 is a top view illustrating a multi-chamber system 100, according to some embodiments of the present disclosure. The multi-chamber system 100 includes a factory interface 110, at least one load lock chamber 120, a buffer chamber 130, and several process chambers 140. For illustration in FIG. 1, the factory interface 110 is coupled to the at least one load lock chamber 120. The at least one load lock chamber 120 is coupled to the buffer chamber 130. The process chambers 140 are disposed around the buffer chamber 130.

In some embodiments, the factory interface 110 is configured to load and transfer wafers to a manufacturing chamber. The factory interface 110 is also coupled to the manufacturing chamber, for example, the load lock chamber 120. In some embodiments, the factory interface 110 further includes a robot (not shown) configured to carry wafers and to transfer the wafers to a predetermined position. In some embodiments, the factory interface 110 is operated under a first environment, for example, the factory interface 110 is kept at room temperature and room pressure, in which the first environment is referred to as an atmosphere transfer driver. It is noted that many possible variations and options of the first environment of the factory interface 110 are within the contemplated scope of the present disclosure, for example, in some other embodiments, the factory interface 110 is operated under a high temperature and low pressure environment.

In some embodiments, the at least one load lock chamber 120 is configured to receive and transfer the wafer from the factory interface 110 and the buffer chamber 130. The load lock chamber 120 includes a valve V1 and a valve V2. The valve V1 and valve V2 are configured to isolate the environment of the load lock chamber 120 from the adjacent device when the valves are closed, and configured to equalize the environment of the load lock chamber 120 and the adjacent device when the valves are open. The load lock chamber 120 further includes a vacuum pump (not shown) configured to vacuum the load lock chamber 120.

In some embodiments, when the load lock chamber 120 is ready for receiving the wafer from the factory interface 110, the valve V1 is open and allows the robot of the factory interface 110 to pass through and place the wafer in position. The valve V2 is closed, and the environment of the load lock chamber 120 has the same environment as the factory interface 110, i.e. the first environment. After the valve V1 is closed, the load lock chamber 120 is vacuumed to, for example, a low pressure such as about 200 m-torrs. Other pressures may also be used, for example, less than 10 m-torrs, as determined by the type of vacuum pump used for vacuuming the load lock chamber 120.

In some embodiments, when the load lock chamber 120 is ready for receiving the wafer from the buffer chamber 130, the valve V2 is open and allows the buffer chamber 130 to pass through and place the wafer in position. The valve V1 is closed, and the environment of the load lock chamber 120 has the same environment as the buffer chamber 130, i.e. a second environment (will be discussed below).

In some embodiments, the buffer chamber 130 includes a robot 131 which has at least one robot blade 132. The robot 131 is movable in three-axes and rotatable at any angles. For illustration in FIG. 1, the robot 131 is disposed at the center of the buffer chamber 130. The robot 131 has two robot blades 132, and the robot blades 132 are each attached to the opposite side of the robot 131. In some embodiments, the robot blade 132 is adapted for handling and transferring the wafer to and from various positions, for example, the load lock chamber 120.

The buffer chamber 130 is coupled to a vacuum system (not shown) so as to provide a reduced atmosphere condition. In some embodiments, the buffer chamber is operated under a high vacuum environment, i.e. the second environment, in order to avoid particle contamination.

In some embodiments, prior to vacuuming the load lock chamber 120, the buffer chamber 130 is already maintained as the second environment so that the environment of the load lock chamber 120 and the buffer chamber 130 are closer.

In some embodiments, two pumping steps are utilized to change an environment from the first environment to the second environment. For example, according the configuration of FIG. 1, the vacuum pump in the load lock chamber 120 and the vacuum system coupled to the buffer chamber 130 are used in these two pumping steps.

In some embodiments, the process chambers 140 are plasma process chambers, deposition process chambers, diffusion chambers, or the combination thereof. The plasma process chamber is configured to operate a dry etching process including, for example, a reactive ion etching (RIE) process. The plasma process chamber provides reactive ion gas so as to react with material layers or the wafer. The deposition process chamber provides a vapor phase of a material including any operations such as, but not limited to, chemical vapor deposition (CVD) and physical vapor deposition (PVD). A material layer can be deposited on the wafer in the deposition process chamber. The diffusion chamber provides a thermal process such as a rapid thermal annealing or a laser annealing. A deposited layer can be annealed in the diffusion chamber. The amount and the configuration of the process chambers 140 shown in FIG. 1 are given for the illustrative purposes. Various amounts and the configuration of the process chambers 140 are within the contemplated scope of the present disclosure.

At least one of the process chambers 140 in the multi-chamber system 100 is deposition process chamber configured for performing a deposition process. For illustration in FIG. 1, the deposition process chamber is connected with the buffer chamber 130. In some embodiments, the wafer is transferred from the buffer chamber 130 to the deposition process chamber by the robot blade 132. After the deposition process performing in the deposition process chamber, the wafer is returned to the buffer chamber 130 by the robot blade 132.

The multi-chamber system 100 further includes at least one measuring device 200 (shown in FIG. 2) equipped in the factory interface 110, the load lock chambers 120, the buffer chamber 130, or the combination thereof. The configuration of measuring device 200 will be discussed below with reference to FIG. 2.

In some embodiments, the measuring device 200 is configured to measure the weight of the wafer before the deposition process to the wafer. Before the deposition process performing to the wafer, the measuring device 200 measures the weight of the wafer. In some embodiments, the measuring device 200 is equipped in the factory interface 110 and measures the weight of the wafer in the factory interface 110 before the wafer is transferred to the load lock chamber 120. In some other embodiments, the measuring device 200 is equipped in the load lock chamber 120 and measures the weight of the wafer in the load lock chamber 120 before the wafer is transferred to the buffer chamber 130. In alternatively embodiments, the measuring device 200 is equipped in the buffer chamber 130 and measures the weight of the wafer in the buffer chamber 130 before the wafer is transferred to the deposition process chamber.

In some embodiments, the measuring device 200 is configured to measure the weight of the wafer after the deposition process to the wafer. After the deposition process performing to the wafer, the measuring device 200 measures the weight of the wafer. In some embodiments, the measuring device 200 is equipped in the buffer chamber 130 and measures the weight of the wafer in the buffer chamber 130 after the wafer is transferred from the deposition process chamber. In some other embodiments, the measuring device 200 is equipped in the load lock chamber 120 and measures the weight of the wafer in the load lock chamber 120 after the wafer is transferred from the buffer chamber 130. In alternative embodiments, the measuring device 200 is equipped in the factory interface 110 and measures the weight of the wafer in the factory interface 110 after the wafer is transferred from the load lock chamber 120.

In some embodiment, the weight measured by the measuring device 200 is converted to a thickness of a corresponding material. The conversion will be discussed below with reference to FIGS. 2-3B.

For illustration in FIG. 1, the measuring device 200 is able to be equipped in position A which corresponds to the factory interface 110, positions B-C which correspond to the load lock chambers 120, or positions D-E which correspond to the robot blade 132 of the robot 131 of the buffer chamber 130. The positions A-E in FIG. 1 are given for illustrative purposes. Various positions are within the contemplated scope of the present disclosure.

In some embodiments, the measuring device 200 is configured to calculate the thickness of the material on the wafer. In some embodiments, the measuring device 200 is configured to determine whether the material on the wafer has a required thickness. Alternatively stated, the measuring device 200 is configured to identify a status of the deposition process.

In some embodiments, the measuring device 200 is configured to perform real-time measurements of thickness of the material on the wafer. The measuring device 200 measures the thickness of the material on the wafer immediately after the deposition process is done. Alternatively stated, the thickness measurement is the immediately next process of the deposition process. There is no other process performed between the deposition process and the thickness measurement except transferring the wafer.

The configuration of the multi-chamber system 100 is given for illustrative purposes. Various configurations of the multi-chamber system 100 are with the contemplated scope of the present disclosure. For example, the multi-chamber system 100 includes more or less process chambers 140.

Figure 2:
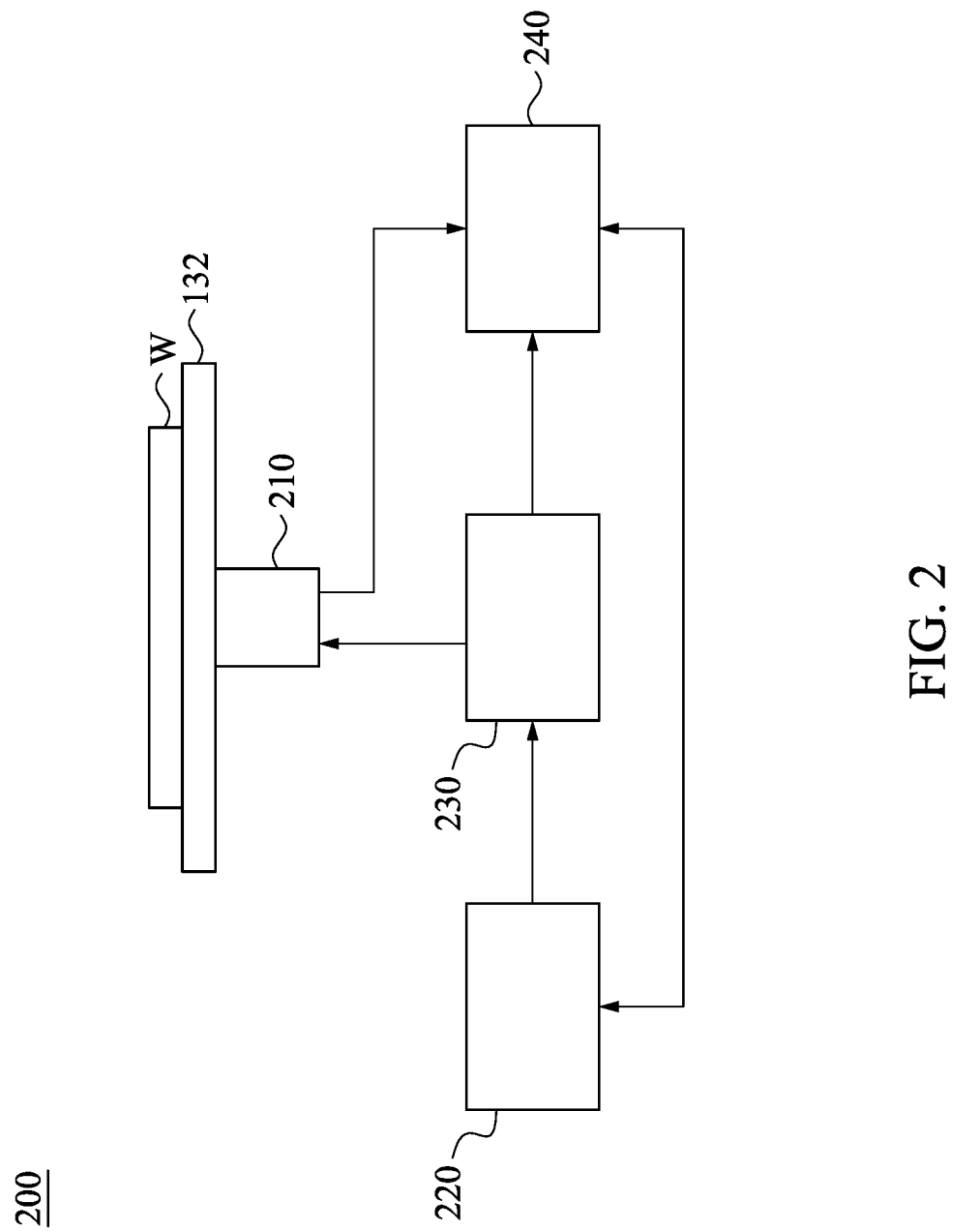
FIG. 2 is a measuring device setup diagram, according to some embodiments of the present disclosure.

Reference is made to FIG. 2. FIG. 2 is a measuring device 200 setup diagram, according to some embodiments of the present disclosure. The measuring device 200 includes a weight meter 210, a process driver 220, a data collection control unit 230, and a processor 240. For illustration in FIG. 2, the data collection control unit 230 is coupled to the weight meter 210. The process driver 220 is coupled to the data collection control unit 230. The weight meter 210, the process driver 220, and the data collection control unit 230 are coupled to the processor 240.

In some embodiments, the weight meter 210 is equipped at the buffer chamber 130. For illustration in FIG. 2, the weight meter 210 is positioned beneath the robot blade 132 of the robot 131 of the buffer chamber 130. During the measurement, the weight meter 210 is configured to make real-time weight measurement of the wafer W. When the measured weight is converted to a thickness corresponding to a material (not shown in FIG. 2), the weight meter 210 is, alternatively stated, configured to performed real-time thickness measurement of the material on the wafer W.

In some embodiments, the weight meter 210 is configured to measure a weight difference between a first measurement and a second measurement. In some embodiments, the first measurement is performed before the deposition process. In some embodiments, the second measurement is performed after the deposition process. Therefore, in some embodiments, the weight difference measured by the weight meter 210 indicates the weight of the material deposited on the wafer W during the deposition process.

Although FIG. 2 does not show any material disposed on the wafer W, it is obvious to one of skill in the art that the wafer W has materials and/or structures disposed thereon after the deposition process.

In some embodiments, the process driver 220 is configured to control the process of the measuring device 200. Accordingly, the process driver 220 is configured to send a signal to the data collection control unit 230 to trigger the operation of the weight meter 210.

In some embodiments, the processor 240 is configured to receive the data from the weight meter 210 and further configured to analyze the data. In some embodiments, the processor 240 is configured to communicate with process driver 220, the data collection control unit 230, the weight meter 210, or the combination thereof.

In some embodiments, the processor 240 includes a model for calculating thickness and non-linear regression routine. The model is configured for calculating the thickness of the material on the wafer W. The non-linear regression routine is configured to search an optimal match between the modeled thickness and the data obtained from the weight meter 210. The regression routine described above is given for explanation purposes. Various regression methods are within the contemplated scope of the present disclosure. For example, in some other embodiments, multivariate regression analysis and neural net matching are used to search the optimal match between the modeled thickness and the data obtained from the weight meter 210.

Figure 3B:
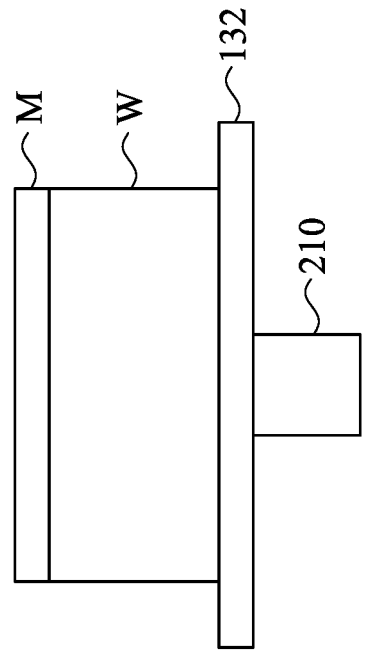
FIG. 3B is a schematic diagram of the thickness measurement to the material on the wafer, according to some embodiments of the present disclosure.
Figure 3A:
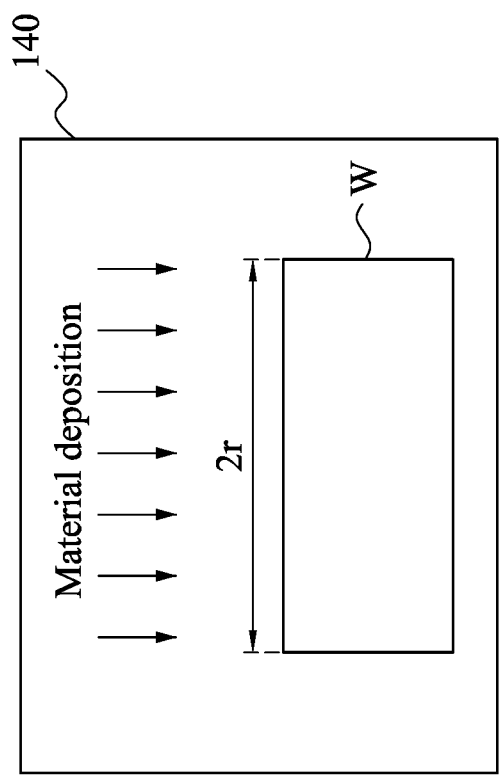
FIG. 3A is a schematic diagram of the deposition process, according to some embodiments of the present disclosure.

Reference is made to FIGS. 3A-3B. FIG. 3A is a schematic diagram of the deposition process, according to some embodiments of the present disclosure. FIG. 3B is a schematic diagram of the thickness measurement to the material on the wafer W, according to some embodiments of the present disclosure.

Before the deposition process, the first measurement is performed to the wafer W. After the first measurement, the wafer W is transferred to the process chamber 140 to be deposited. For illustration in FIG. 3A, the wafer is disposed at the process chamber 140. The wafer has a radius r. The material M is deposited to the surface of the wafer W. Accordingly, the deposited material M forms a layer of the material M on the wafer W.

For illustration in FIG. 3B, the deposited material M forms a uniform layer with an even spread surface. Accordingly, the layer has a uniform thickness d. After the deposition process, the wafer is transferred by the robot blade 132 of the robot 131 of the buffer chamber 130. The weight meter 210 is equipped in the robot blade 132. The second measurement is performed to the wafer with the layer of the material M.

The measured data of the first measurement and the second measurement is sent to the processor 240. The processor 240 calculates the weight difference after and before the deposition process. According to the density of the material M, the thickness d is calculated by the following equation:

$$d = \frac{\delta}{\pi r^2 \rho}$$

$\delta$ is the weight difference of the first measurement and the second measurement. $\rho$ is the density of the material M. $\pi$ is the circular constant.

Based on the discussion above, the thickness of the material M is able to be calculated from the weight measurements. In some embodiments, when the material M is non-evenly deposited on the wafer, for example, the thickness is different from different locations on the wafer W, an average thickness of the material M is obtained from the above discussion.

Figure 4:
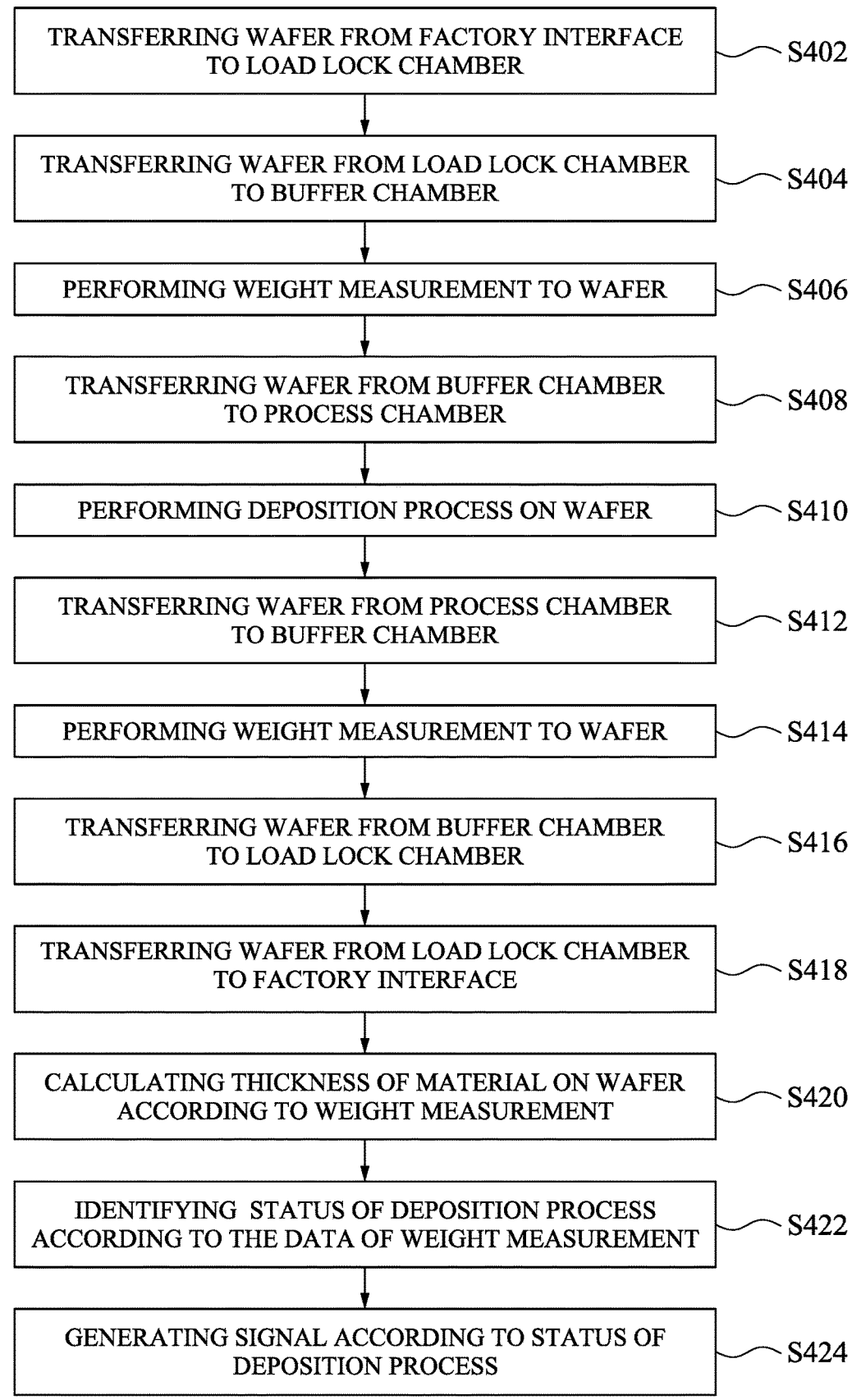
FIG. 4 is a flow chart of a method for measuring the thickness, according to some embodiments of the present disclosure.

Reference is made to FIG. 4. FIG. 4 is a flow chart of a method 400 for measuring the weight of the material on the wafer and converting the measured weight to the thickness of the material, according to some embodiments of the present disclosure. The method 400 includes operations S402-S424. The operations S402-S424 will be discussed with reference to FIGS. 1-3B below.

In operation S402, with reference to FIG. 1, the wafer in the factory interface 110 is transferred by the robot in the factory interface 110 to the load lock chamber 120 through the valve V1. Before transferring the wafer, the wafer is loaded in the factory interface 110 under the first environment. In some embodiments, the first environment is under atmosphere and room temperature. Then the valve V1 between the load lock chamber 120 and the factory interface 110 is open. The environment in the factory interface 110 and the load lock chamber 120 are equalized. In some embodiments, before the valve V1 is open, a ventilation process is performed to the load lock chamber 120 to make the environment in the load lock chamber 120 similar to the first environment. Then, after the valve V1 is open, the environment in the factory interface 110 and the load lock chamber 120 are equalized, the wafer is transferred from the factory interface 110 to the load lock chamber 120. For illustration in FIG. 1, the wafer is transferred to position B in the load lock chamber 120. After the wafer is transferred to the load lock chamber 120, the valve V1 is closed in order to isolate the environment between the load lock chamber 120 and the factory interface 110.

In operation S404, with reference to FIG. 1, the wafer is transferred from the load lock chamber 120 to the buffer chamber 130 through the valve V2 and is received by the robot blade 132 of the robot 131 of the buffer chamber 130. Before transferring the wafer, the valve V1-V2 are closed, and the environment in the load lock chamber is kept in the first environment. In some embodiments, before the valve V2 is open, a vacuum process is performed on the load lock chamber 120 to make the environment in the load lock chamber 120 similar to the environment in the buffer chamber 130 (i.e., the second environment). Then, after the valve V2 is open, the environment in the load lock chamber 120 and the buffer chamber 130 are equalized, and the wafer is transferred from the load lock chamber 120 to the buffer chamber 130. For illustration in FIG. 1, the wafer is transferred from the position B in the load lock chamber 120 to the position D or the position E in the buffer chamber 130 by the robot blade 132 of the robot 131 of the buffer chamber 130. After the wafer is transferred to the buffer chamber 130, the valve V2 is closed in order to isolate the environment between the load lock chamber 120 and the buffer chamber 130.

Generally speaking, the pressure in the second environment is lower than the pressure than in the first environment. The buffer chamber 130 and process chambers 140 are constantly kept in the second environment in order to avoid particles or other contamination from the outside environment. In some embodiments, the second environment is suitable for plasma generation. In some embodiments, the second environment is suitable for CVD and PVD processes. In some embodiments, the second environment is suitable for sputtering, thermal evaporating, or other deposition processes.

In operation S406, with reference to FIGS. 1-2, the weight measurement is performed to the wafer in the position D in buffer chamber 130. When the wafer is transferred to the position D or position E, the process driver 220 sends a signal to the data collection control unit 230 to trigger the weight meter 210. After the weight meter 210 is triggered, the weight meter 210 measures the weight of the wafer and transfers the measured data to the processor 240. The operation S406 is performed before the deposition process. There is no other process performed between the operation S406 and the deposition process except transferring the wafer. The operation S406 is also referred as the first measurement.

In some embodiments, the operation S406 is able to be operated in positions A, B, or C. In some other embodiments, the operation S406 is able to be operated before the operation S404 or operation S402.

In operation S408, with reference to FIG. 1, the wafer in the buffer chamber 130 is transferred to one of the process chambers 140 by the robot blade 132 of the robot 131 of the buffer chamber 130. For illustration in FIG. 1, the wafer is transferred from the position D or position E to the process chamber 140. In some embodiments, before the wafer is transferred, a vacuum process is performed on the buffer chamber 130 in order to compensate the pressure change during the valve V2 is open. In some other embodiments, the vacuum process on the buffer chamber 130 is constantly performed in order to avoid contamination and save process time.

In operation S410, with reference to FIG. 3A, the deposition process is performed to the wafer in the process chamber 140. In some embodiments, the deposition process is configured to deposit metal on the wafer. In some other embodiments, the deposition process is configured to deposit alloy on the wafer. In alternatively embodiments, the deposition process is configured to deposit insulator on the wafer. The materials the deposition process deposited are given for the explanation purposes. Various materials which are deposited by the deposition process are within the contemplated scope of the present disclosure.

In operation S412, with reference to FIG. 1, the wafer in the process chamber 140 is transferred to the buffer chamber 130 after the deposition process is done. For illustration in FIG. 1, the wafer is transferred from the process chamber 140 to the position D or position E by the robot blade 132 of the robot 131 of the buffer chamber 130.

In operation S414, with reference to FIGS. 1-2, the weight measurement is performed to the wafer in the position D in buffer chamber 130. When the wafer is transferred to the position D or position E, the process driver 220 sends a signal to the data collection control unit 230 to trigger the weight meter 210. After the weight meter 210 is triggered, the weight meter 210 measures the weight of the wafer with the deposited material and transfers the measured data to the processor 240. The operation S412 is performed after the deposition process. There is no other process performed between the operation S414 and the deposition process except transferring the wafer. The operation S414 is also referred as the second measurement.

In some embodiments, the operation S414 is able to be operated in positions A, B, or C. In some other embodiments, the operation S414 is able to be operated after the operation S416 or operation S418.

In operation S416, with reference to FIG. 1, the wafer in the buffer chamber 130 is transferred to the load lock chamber 120 through the valve V2 by the robot blade 132 of the robot 131 of the buffer chamber 130. Before transferring the wafer, the valves V1-V2 are closed, and the environment in the load lock chamber is kept in the second environment since the valves V1-V2 are kept closed after the operation S404. Then, after the valve V2 is open, the wafer is transferred from the buffer chamber 130 to the load lock chamber 120. For illustration in FIG. 1, the wafer is transferred from the position D or the position E in the buffer chamber 130 to the position B by the robot blade 132 of the robot 131 of the buffer chamber 130. After the wafer is transferred to the load lock chamber 120, the valve V2 is close in order to isolate the environment between the load lock chamber 120 and the buffer chamber 130.

In operation S418, with reference to FIG. 1, the wafer in the load lock chamber 120 is transferred to the factory interface 110 by the robot in the factory interface 110 through the valve V1. Before transferring the wafer, the valves V1-V2 are closed. In some embodiments, before the valve V1 is open, a ventilation process is performed on the load lock chamber 120 to make the environment in the load lock chamber 120 similar to the first environment in the factory interface 110. The ventilation process is performed to protect the load lock chamber 120 and the factory interface 110 from the damage due to the sudden pressure change between the first environment and the second environment during the valve V1 is opening. Alternatively stated, the ventilation process is performed to protect the vacuum pump in the load lock chamber 120 from the immediate pressure change. Then, after the valve V1 is open, the environment in the load lock chamber 120 and the factory interface 110 are equalized, the wafer is transferred from the load lock chamber 120 to the factory interface 110. For illustration in FIG. 1, the wafer is transferred to the position A in the factory interface 110 from the position B in the load lock chamber 120 by the robot of the factory interface 110.

In operation S420, with reference to FIG. 2, the processor 240 calculates the weight difference between the first measurement and the second measurement. The processor further calculates the thickness of the material on the wafer according the density of the material, the radius of the wafer, and the weight difference between the first measurement and the second measurement.

In operation S422, with reference to FIG. 2, the processor 240 identifies a status of the deposition process according to the data of the weight measurement. After the thickness is calculated, the non-linear regression routine in the processor 240 searches the optimal match between the modeled thickness and the calculated thickness obtained from the weight meter 210.

When the deposition process is performed completely, the deposited material has a required thickness. The processor 240 is able to identify the deposition process is performed successfully. In this circumstance, the status of the deposition process is identified as "PASS."

When the deposition process is not performed completely, the deposited material has a thickness higher or lower than the required thickness. The processor 240 is able to identify the deposition process is performed un-successfully. In this circumstance, the status of the deposition process is identified as "FAIL."

In operation S424, the measuring device 200 generates a signal according to the status of the deposition process. The signal is configured for informing the user or the control system of the status of the deposition process.

In some approaches, when the thickness measurement is not performed after the deposition process, the status of the deposition process is not able to be known immediately. Accordingly, if the deposition process is failed in a batch of wafers, this batch of wafers wastes time and resource to perform the following processes until the test or measurement is done. Alternatively stated, off-line measurement tends to waste time and resource when the status of a deposition process is "FAIL."

Compared to the above approaches, in the embodiments of the present disclosure, the weight measurement is performed before and after the deposition process. The thickness is calculated from the weight measured by the weight measurement. The status of the deposition process is able to be known immediately after the deposition process is finished. Alternatively stated, the thickness measurement is a real-time measurement. It provides a real-time monitor to the deposition process. Therefore, when a wafer is processed under a deposition process identified as "FAIL", the user or the system is able to recognize that the wafer is potential to be bad. The user or the system is able to stop the following processes to the wafer. Accordingly, the waste of time and the resource of the processes for the bad wafers are able to be prevented.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, the operations S420-S424 are able to be operated before or in parallel with the operation S416.

Figure 5:
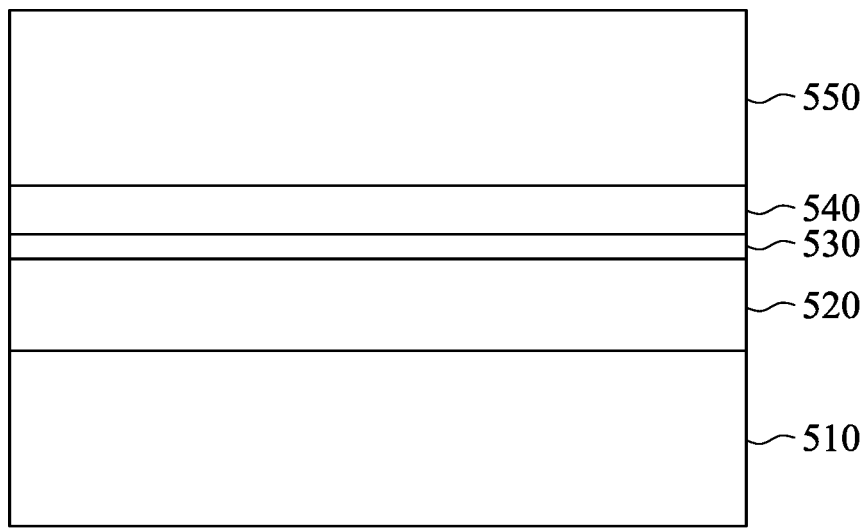
FIG. 5 is a schematic cross-section diagram of part of a semiconductor device, according to some embodiments of the present disclosure.

Reference is made to FIG. 5. FIG. 5 is a schematic cross-section diagram of part of a semiconductor device 500, according to some embodiments of the present disclosure. The semiconductor device 500 includes layers 510, 520, 530, 540, and 550. For illustration in FIG. 5, the layer 520 is formed on the layer 510, the layer 530 is formed on the layer 520, the layer 540 is formed on the layer 530, and the layer 550 is formed on the layer 540.

In some embodiments, the layers 510, 520, 530, 540, and 550 are substantially flat. Alternatively stated, the layers 510, 520, 530, 540, and 550 are formed uniformly, respectively. In some embodiments, the thickness of each layer 510, 520, 530, 540, and 550 are different from each other. In some embodiments, the layer 510 includes un-doped silicate glass (USG), the layer 520 includes tantalum nitride (TaN). The layer 530 includes high dielectric constant materials, the combination thereof, or the like. The layer 540 includes oxide. The layer 550 includes silicon nitride (SiN). The number and the material of the layers of the semiconductor device 500 are given for illustrative proposes. Various numbers and materials of the layers of the semiconductor device 500 are within the contemplated scope of the present disclosure.

In some embodiments, at least one of the layers 510, 520, 530, and 540 is formed and/or measured by some operations of the method 400 shown in FIG. 4. For example, the layer 530 is formed by the operation S410 of the method 400. The layer 530 is deposited on the layer 520. The thickness of the deposited layer 530 is then measured by the operation S414 of the method 400, before forming the next layer 540, and then the state of the deposition process of layer 530 is identified. In some embodiments, when the state of the deposition process of layer 530 is "PASS," the flow of forming the semiconductor device 500 is proceeded to the next process. In some other embodiments, when the state of the deposition process of layer 530 is "FAIL," the layer 530 may not satisfy the requirements to form the semiconductor device 500.

In some embodiments, a system includes a factory interface, a deposition tool, and at least one measuring device. The factory interface is configured to carry a wafer. The deposition tool is coupled to the factory interface and configured to process the wafer transferred from the factory interface. The at least one measuring device is equipped in the factory interface, the deposition tool, or the combination thereof. The at least one measuring device is configured to perform real-time measurements of a thickness of a material on the wafer that is carried in the factory interface or the deposition tool.

Also disclosed is that a system includes a factory interface, a plurality of load lock chambers, a buffer chamber, a plurality of process chambers, and at least one measuring device. The plurality of load lock chambers is coupled to the factory interface and configured to load and transfer wafers from the factory interface. The buffer chamber is coupled to the factory interface through the plurality of load lock chambers, and the buffer chamber is configured to receive the wafers from the plurality of load lock chambers. The plurality of process chambers is disposed around and coupled to the buffer chamber, and the plurality of process chambers is configured to process the wafers from the buffer chamber. The at least one measuring device is equipped in the factory interface, the at least one of the plurality of load lock chambers, the buffer chamber, or the combination thereof, to perform reflectance measurements to the wafers carried therein.

Also disclosed is that a method includes transferring a wafer from a factory interface through a load lock chamber to a buffer chamber, transferring the wafer from the buffer chamber to a process chamber, depositing the wafer by the process chamber to deposit a material on the wafer, and after the wafer is deposited, performing weight measurements to the wafer in the factory interface, the load lock chamber, the buffer chamber, or the combination thereof, to detect whether the material has a required thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a factory interface configured to carry a wafer;
a deposition tool coupled to the factory interface and configured to process the wafer transferred from the factory interface; and
a plurality of measuring devices equipped in the factory interface and the deposition tool,
wherein the plurality of measuring devices are configured to perform real-time measurements of a thickness of a material on the wafer that is carried in the factory interface and the deposition tool,
the deposition tool comprises a buffer chamber comprising a robot having at least one robot blade, and
at least one of the plurality of measuring devices is positioned beneath and equipped at the at least one robot blade.

2. The system of claim 1, wherein each one of the plurality of measuring devices is further configured to generate data associated with a weight change of the wafer indicating the thickness of the material on the wafer.

3. The system of claim 2, wherein the data is for determining whether the material has a required thickness on the wafer after being processed by the deposition tool.

4. The system of claim 1, wherein the deposition tool comprises:
at least one load lock chamber coupling the buffer chamber to the factory interface,
wherein the plurality of measuring devices are equipped in the buffer chamber, and the at least one load lock chamber.

5. The system of claim 1, wherein the buffer chamber is coupled to the factory interface through at least one load lock chamber, and the at least one robot blade is configured to handle and transfer the wafer to and from various positions,
wherein each one of the plurality of measuring devices comprises a thickness measuring device, and the thickness measuring device is equipped at the at least one robot blade.

6. The system of claim 5, wherein the deposition tool further comprises:
a plurality of process chambers coupled to the buffer chamber,
wherein a first process chamber of the plurality of process chambers is configured to receive the wafer transferred from the buffer chamber and configured to deposit the material on the wafer.

7. The system of claim 5, wherein at least one of the plurality of measuring devices further comprises:

a processor coupled to a data collection control unit and configured to receive data associated with a weight change that indicates the thickness of the material on the wafer.

8. A system, comprising:
a factory interface;
a plurality of load lock chambers coupled to the factory interface and configured to load and transfer wafers from the factory interface;
a buffer chamber coupled to the factory interface through the plurality of load lock chambers, the buffer chamber configured to receive the wafers from the plurality of load lock chambers, and the buffer chamber comprising a robot having a robot blade;
a plurality of process chambers disposed around and coupled to the buffer chamber, the plurality of process chambers configured to process the wafers from the buffer chamber; and
a plurality of measuring devices equipped in the factory interface and at least one of the plurality of load lock chambers, and positioned beneath and equipped at the robot blade of the robot in the buffer chamber, to perform real-time measurements of thicknesses of materials on the wafers carried therein.

9. The system of claim 8, wherein the robot blade is configured to handle and transfer a first wafer of the wafers to and from various positions,
wherein at least one of the plurality of measuring devices comprises a weight measuring device, and the weight measuring device is equipped at the robot blade.

10. The system of claim 9, further comprising:
a processor coupled to the plurality of measuring devices, the processor configured to generate an activation signal when receiving data associated with a weight change, from at least one of the plurality of measuring devices, for determining whether a material on the first wafer of the wafers has a required thickness after being processed by the plurality of process chambers.

11. The system of claim 9, further comprising:
a processor coupled to the plurality of measuring devices, the processor configured to identify a status of a deposition process performed by the plurality of process chambers according to a weight change measured by the weight measuring device.

12. The system of claim 8, further comprising:
a processor coupled to the plurality of measuring devices, the processor configured to generate an activation signal when receiving a data associated with a weight change, from each of the plurality of measuring devices, wherein the weight change indicates a thickness of a material on a first wafer of the wafers after being deposited by a first process chamber of the plurality of process chambers.

13. The system of claim 8, wherein each of the plurality of measuring devices is further configured to calculate a thickness of a material on a first wafer of the wafers according to a weight change measured by the at least one measuring device.

14. A system, comprising:
a factory interface;
a plurality of weight measuring devices that are separated from each other;
a plurality of load lock chambers, wherein at least one of the plurality of weight measuring devices is equipped in the plurality of load lock chambers; and
a buffer chamber coupled between the factory interface and the plurality of load lock chambers, and comprising a robot having a robot blade, wherein one of the plurality of weight measuring devices is equipped in the buffer chamber, and one of the plurality of weight measuring devices is positioned beneath and equipped at the robot blade, wherein a wafer is configured to be transferred from the factory interface through one of the plurality of load lock chambers to the buffer chamber, and wherein real-time measurements are performed to calculate a thickness of a material on the wafer in the one of the plurality of load lock chambers and in the buffer chamber, by the plurality of weight measuring devices.

15. The system of claim 14, wherein at least one of the plurality of weight measuring devices is equipped in the factory interface, and the factory interface is configured to carry the wafer.

16. The system of claim 14, further comprising:
a plurality of process chambers coupled to the buffer chamber, wherein a first process chamber of the plurality of process chambers is configured to receive the wafer transferred from the buffer chamber and configured to deposit the material on the wafer; and
a processor coupled to the plurality of weight measuring devices, wherein the processor is configured to calculate the thickness of the material on the wafer according to the real-time measurements before and after the wafer is deposited.

17. The system of claim 16, wherein the processor is further configured to identify a status of a deposition process on the wafer according to data measured by the real-time measurements.

18. The system of claim 16, wherein the plurality of weight measuring devices are further configured to perform the real-time measurements before the wafer is deposited in the plurality of load lock chambers and the buffer chamber, and to generate data associated with a weight change that indicates the thickness of the material on the wafer.

19. The system of claim 18, wherein the processor is further configured to generate an activation signal when receiving the data associated with the weight change, from the plurality of weight measuring devices, for determining whether the material on the wafer has a required thickness after being processed by the first process chamber.

20. The system of claim 14,
wherein the robot blade is configured to handle and transfer the wafer to and from various positions.

* * * * *